United States Patent [19]

Pinckaers

[11] 3,825,852

[45] July 23, 1974

[54] CONTROL SYSTEM COMPRISING DIFFERENTIAL AMPLIFIER WITH DUAL CURRENT COMPARATOR HAVING TWO OUTPUTS SEPARATED BY A DEADBAND

[75] Inventor: B. Hubert Pinckaers, Edina, Minn.

[73] Assignee: Honeywell Inc., Minneapolis, Minn.

[22] Filed: Oct. 5, 1972

[21] Appl. No.: 295,398

[52] U.S. Cl. .................................. 330/30 D, 330/69

[51] Int. Cl. .............................................. H03f 3/68

[58] Field of Search ............................ 330/30 D, 69

[56] References Cited

UNITED STATES PATENTS

| | | | |
|---|---|---|---|
| 3,519,850 | 7/1970 | Smith | 330/30 D X |
| 3,568,081 | 3/1971 | Pinckaers | 330/69 X |
| 3,673,508 | 6/1962 | Callahan, Jr. | 330/30 D |

*Primary Examiner*—Herman Karl Saalbach
*Assistant Examiner*—Lawrence J. Dahl
*Attorney, Agent, or Firm*—Lamont B. Koontz; Omund R. Dahle

[57] ABSTRACT

A condition responsive circuit, disclosed as an automatic changeover heat-cool solid state thermostat, is adapted to be connected by three terminals to one or the other alternating current load and to a source of alternating current potential. The solid state condition responsive system uses an improved differential amplifier with dual current comparators and has two outputs separated by a deadband. The differential amplifier and the two current comparators control the firing of a silicon controlled rectifier in the first or second outputs when there is a need to energize one or the other load. The AC supply voltage to the condition responsive system amplifier and current comparators is shorted out early in each half cycle by a four layer diode across the input of the condition responsive circuit. This arrangement allows for switching to a relatively high impedance within the condition responsive circuit to virtually eliminate the power dissipation therein except during the initial portion of each applied waveform and thus also insures that switching of the silicon controlled rectifiers and triacs only occurs near the voltage crossover of the alternating current supply.

7 Claims, 6 Drawing Figures

CONTROL SYSTEM COMPRISING DIFFERENTIAL AMPLIFIER WITH DUAL CURRENT COMPARATOR HAVING TWO OUTPUTS SEPARATED BY A DEADBAND

BACKGROUND AND SUMMARY OF THE INVENTION

The present invention is of particular utility in the field of temperature control as the invention allows for the automatic switching from heating to cooling in a system. This improved differential amplifier and current comparators invention is related to my earlier condition responsive U.S. Pat. Nos. 3,543,176 and 3,514,628 which patents disclosed condition responsive bridge circuits supplying a signal to a differential amplifier and single ended current comparator.

The single ended differential amplifier and current comparator circuits have been useful in the field of solid state thermostats such as that shown in my copending application Ser. No. 169,565, filed Aug. 5, 1971, titled "Condition Responsive Circuit with Limited Internal Dissipation" and assigned to the same assignee as the present invention. In that invention for a two-wire, solid state, on-off thermostat for control of an alternating current load, the electronic thermostat is energized through the load that it is to control from a source of alternating current potential and a decision is made at the beginning of each cycle to determine whether a solid state power switching means across the terminals of the condition responsive circuit is to be energized. If the solid state switching means is not to be energized, the decision making circuit itself is switched off for the remainder of that half cycle to limit the power dissipation within the device.

In the system of the present invention to provide an automatic changeover, heat-cool, solid state thermostat, a new differential amplifier with dual current comparator is disclosed, which provides a double ended output and further in which there is electronically provided a deadband separating the outputs.

DESCRIPTION OF THE PREFERRED EMBODIMENT

Figure 1:
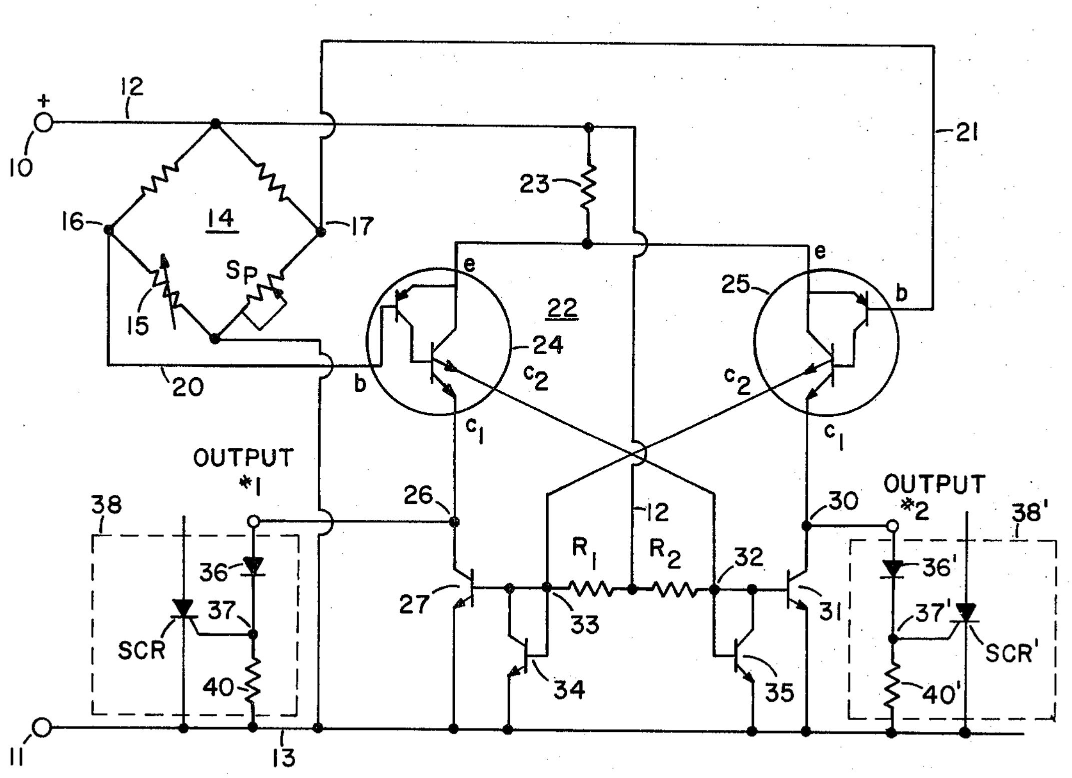
FIG. 1 is a schematic representation of an embodiment of the improved differential amplifier and dual current comparators with FIGS. 1*a*, 1*b* and 1*c* showing equivalents of certain components in FIG. 1.

Referring now to FIG. 1, there is shown schematically an embodiment of the invention in which a source of electrical energy, not shown, is connected to terminals 10 and 11, the terminal 10 being positive with respect to terminal 11, the terminals connecting to conductors 12 and 13 respectively. From the positive conductor 12 a circuit may be traced through a conventional condition responsive bridge circuit 14, having a condition responsive impedance element 15 and a set point potentiometer to negative conductor 13. In one specific embodiment the element 15 is a NTC resistor. Output terminals 16 and 17 of the bridge connect by conductors 20 and 21 to the inputs of a differential amplifier generally shown at 22.

Figure 1A:
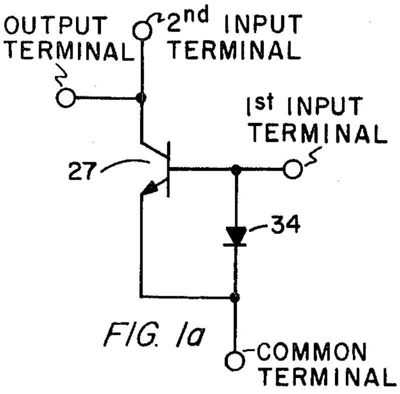
Figure 1B:
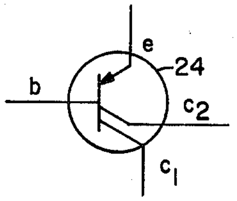
Figure 1C:
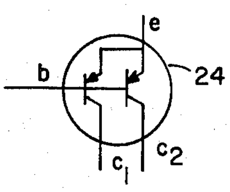

The differential amplifier 22 comprises a common emitter or input resistor 23, a first transistor means 24 and a second transistor means 25 identical to the first. The transistor means 24, in its most elementary state may be considered as a PNP transistor having a control or base electrode, an input or emitter electrode, and two collector or current source electrodes, as is shown in FIG. 1*b*. This is a transistor means having two current source output electrodes and preferably equal current source output electrodes. The electrodes are labeled *e*, *b*, $c_1$ and $c_2$. Because of the state of the art problems in making a high quality device in its most elementary form in an integrated circuit, the present integrated circuit state of the art first transistor means 24 is disclosed in FIG. 1 as a PNP transistor with its collector electrode connected to the base electrode of a double emitter NPN transistor, the emitter of the PNP and the collector of the NPN also being connected together. This composite transistor means 24 provides the electrical equivalent of that shown in FIG. 1*b*, i.e. the emitters of the composite transistor means are the two current source output electrodes $c_1$ and $c_2$. Another embodiment approximating the same transistor means 24 is shown in FIG. 1*c* in which two PNP transistors are used, the emitter electrodes being connected together as the input electrode, the base electrodes being connected together as the control electrode, and the collector electrodes being brought out individually as the current source electrodes.

In this differential amplifier 22 comprising common resistor 23, transistor means 24 and transistor means 25, the outputs of the condition responsive bridge 14 are connected by the conductors 20 and 21 to the electrodes *b* of the means 24 and 25. The common resistor 23 connects the positive conductor 12 to the electrodes *e* of means 24 and 25. The electrode $c_1$ of means 24 is connected by a junction 26 and the collector-emitter path of a NPN current comparator transistor 27 to the negative conductor 13. Similarly the electrode $c_1$ of means 25 is connected by a junction 30 and the collector-emitter path of a NPN current comparator transistor 31 to the conductor 13. The electrode $c_2$ of means 24 is directly connected to the base electrode of transistor 31 at a junction 32. The electrode $c_2$ of means 25 is directly connected to the base electrode of transistor 27 at a junction 33. The junction 33 is also connected to the positive conductor 12 by a resistor R1 and to the negative conductor 13 by a biasing and temperature compensating diode 34. FIG. 1*a* shows the diode 34 in its most elemental schematic form and FIG. 1 shows the diode in integrated circuit form wherein a transistor has its collector and base shorted together to form the diode. Similarly the junction 32 is connected to conductor 12 by a resistor R2 and to the conductor 13 by a biasing and temperature compensating diode 35. In integrated form the biasing diode 34 is a transistor exactly matched to transistor 27 located on the same chip and in close proximity.

The junctions 26 and 30 provide two outputs, namely, an output no. 1 terminal and an output no. 2 terminal. From the output no. 1 terminal may be connected any suitable output circuit 38, however, for illustrative purposes the output 1 terminal is connected by a duide 36, a junction 37 and a resistor 40 to conductor 13. Junction 37 is connected to the gate of a SCR. A similar output circuit is shown connected to output no. 2.

Figure 2:
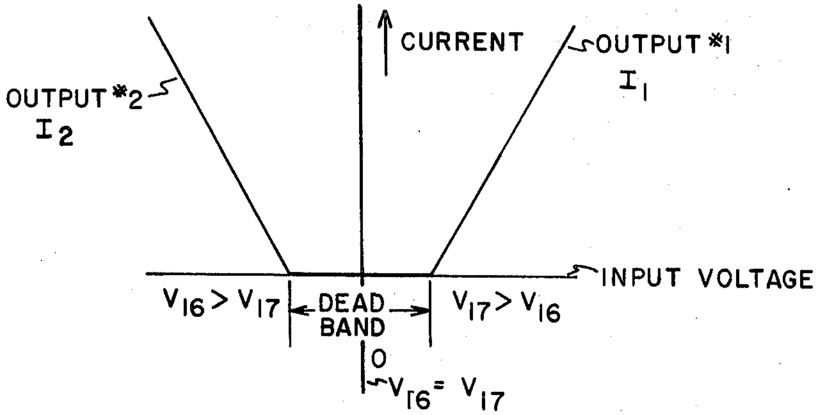
FIG. 2 is a graphical representation of certain operating parameters of FIG. 1.

In considering the operation of the invention of FIG. 1, let it first be assumed that the control system is satisfied, that is, the bridge 14 is at or near balance so that the output is within the deadband (FIG. 2). Under these balanced conditions both transistor means 24 and transistor means 25 are conductive by approximately equal amounts. Transistor means 24 is turned on by a current path which may be traced from conductor 12, resistor 23, electrode 24*e*, electrode 24*b*, conductor 20, junction 16 and resistor 15 to negative conductor 13. A similar path can be traced for transistor means 25. Since transistor means 24 is conductive there are equal currents flowing from current source electrodes 24$c_1$ and 24$c_2$. Transistor means 25 also being conductive, there are equal currents flowing from each of current source electrodes 25$c_1$ and 25$c_2$.

Current comparator transistor 27 and 31 are each biased conductive a predetermined amount by the bias currents flowing in resistors R1 and R2. The selected resistance of R1 and R2 determines the width of the deadband (FIG. 2). Adding together with the bias current through R1 for transistor 27 is the current from current source electrode 25$c_2$. Adding together with the bias current through R2 for transistor 31 is the current from current source electrode 24$c_2$. FIG. 1*a* shows that the base electrode of current comparator transistor 27 may be considered as the first control input terminal, the collector electrode may be considered as the second input terminal, the output terminal also being connected to this electrode, and the emitter electrode may be considered as the common terminal. The current comparator receives a current $I_1$ at the first control input terminal and reproduces $I_1$ at the collector electrode. If the current $I_2$ from transistor electrode 24$c_1$ is less than $I_1$ $_{then\ I\ out} = 0$. If the current $I_2$ from electrode 24$c_1$ is greater than $I_1$ then $I\ out = I_2 - I_1$. Current comparator transistors 27 and 31 may therefore be considered as a current "sink," respectively, for the current flowing from the $c_1$ electrode of transistor means 24 and 25 with their collector electrodes being current source electrodes. Under conditions of balance or near balance transistors 27 and 31 accept all of the current from transistor means 24 and 25, the potentials at junctions 26 and 30 are very low, that is, near the potential of conductor 13, and no output current is flowing through diodes 36 and 36' so that the SCR's are off or nonconductive.

Let it now be assumed that the bridge 14 becomes increasingly unbalanced in a direction such that terminal 17 is less positive than terminal 16. Transistor means 25 then becomes more conductive and transistor means 24 becomes less conductive. It then follows that the currents in electrodes 24$c_1$ and 24$c_2$ decrease while the currents in electrodes 25$c_1$ and 25$c_2$ increase. Current comparator transistor 31 thus receives less base bias current and current comparator transistor 32 receives more base bias current. As the unbalance of the bridge increases, a point is reached at which the current from electrode 25$c_1$ begins to exceed the amount which the collector-emitter circuit of current comparator transistor 31 will accept. At that point the excess current begins to flow (FIG. 2) in output no. 2 through diode 36' and resistor 40' to turn on the SCR'. An unbalance of the bridge in the opposite direction will cause an output current to flow at output terminal no. 1.

Figure 3:
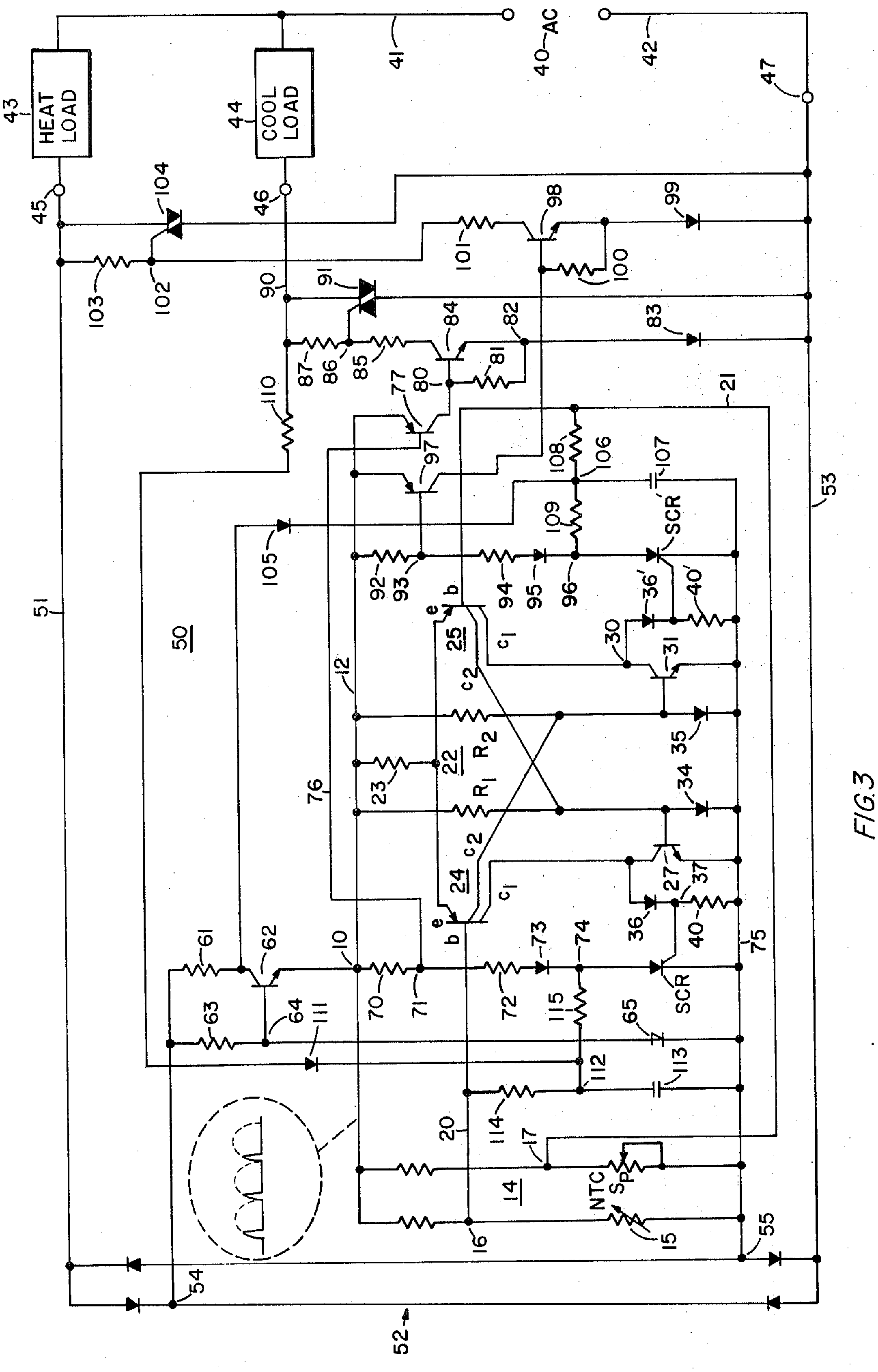
FIG. 3 is a schematic representation of the automatic changeover heat-cool system.

Referring now to the system of FIG. 3 a voltage source of alternating current 40 is disclosed which could for example be supplied from the secondary winding of a stepdown control transformer. The source 40, is supplied by conductors 41 and 42 to three terminals 45, 46 and 47; by conductor 41 to a heat load 43 and a cool load 44 which connect respectively to two terminals 45 and 46, and by conductor 42 to a third terminal 47 of a condition responsive circuit generally shown at 50. The condition responsive circuit 50 is thereby adapted to energize the heating load means 43 and the cooling load means 44 as necessary from the source 40. Terminal 45 is connected by a conductor 51 to rectifier means 52 made up of four diodes in a fullwave bridge, which rectifying means in turn is connected by a conductor 53 back to the terminal 47. With this arrangement, a fullwave rectified, but unfiltered, voltage is available at the rectifier means output terminals 54 and 55.

A circuit means may be traced from the positive rectifier terminal 54 through an impedance or resistor 61 to a solid state switch means or transistor 62 and through the condition responsive bridge means 14, the lower end of which is connected back to the terminal 55. Also connected across the terminals 54 and 55 is a series circuit for providing a control bias to transistor 62 comprising a resistor 63, a junction 64 and a four layer diode 65. The junction 64 is directly connected to the base electrode of the transistor 62. At the beginning of each half cycle of the applied line voltage, a current flow through resistor 63 to turn on transistor 62 and a rising voltage is applied across the voltage breakdown means or four layer diode 65 until its breakdown voltage has been reached, at which time it suddenly conducts thereby shorting the junction 64 to the rectifier terminal 55. Thus at the beginning of each half cycle of the applied line voltage, the transistor 62 is rendered conductive to provide a positive rising voltage on the conductor 12 until such time as the four layer diode breaks over. Then for the remainder of each half cycle the condition responsive circuit 50 is inoperative due to a lack of operating voltage on conductor 12.

The condition responsive circuit 14 as well as the differential amplifier and current comparator 22 is shown in FIG. 3 with the same identifying numerals shown and described with reference to FIG. 1. Like number numerals provide the same function and operate in the same way in FIG. 3 as has been described above.

Referring now to the portion of FIG. 3 which includes the SCR, a circuit may be traced from the conductor 12 at junction 10 through a resistor 70, a junction 71, a resistor 72, a diode 73, a junction 74 and the SCR to the conductor 75 which is connected to the rectifier terminal 55. An output from this circuit is taken from the junction 71 through a conductor 76 to the base electrode of a PNP transistor 77, the emitter of which is connected to the conductor 12. The collector of transistor 77 is connected by a junction 80, a resistor 81, a junction 82 and a diode 83 to the conductor 53. Connected to junctions 80 and 82 respectively are the base and emitter of a NPN transistor 84, the collector of which is connected by a resistor 85, a junction 86, a resistor 87 and a conductor 90 to the terminal 46. The junction 86 is directly connected to the gate electrode of a triac 91, the current carrying electrodes of the triac being connected to conductors 90 and 53 and thereby to terminals 46 and 47.

A circuit may also be traced from the conductor 12 through a resistor 92, a junction 93, a resistor 94, a diode 95, a junction 96 and the SCR' to the conductor 75. An output from this circuit is taken from the junction 93 to the base electrode of a PNP transistor 97, the emitter of which is connected to conductor 12 and the collector of which is connected through the base-emitter path of a NPN transistor 98 and a diode 99 to the conductor 53. A resistor 100 is connected from base to emitter of transistor 98. The collector electrode of transistor 98 is connected by a resistor 101, a junction 102 and a resistor 103 to the conductor 51. The junction 102 is directly connected to the gate electrode of a triac 104, the current carrying electrodes of the triac being connected to conductors 51 and 53 and thereby to terminals 45 and 47.

The control circuit 50 also includes another current path for capacitor charging and discharging which may be traced from the collector electrode of transistor 62 through a diode 105, a junction 106, and a capacitor 107 to the conductor 75. From the junction 106 a resistor 108 is connected to conductor 21 and a resistor 109 to the junction 96. A similar current path for capacitor charging and discharging may be traced from the conductor 90 through a resistor 110, a diode 111, a junction 112, and a capacitor 113 to the conductor 75. The junction 112 is connected by a resistor 114 to the conductor 20 and by a resistor 115 to the junction 74.

OPERATION OF FIG. 3

As has been explained in detail in application Ser. No. 169,565, above mentioned, the resistive value of element 63 is high with respect to element 61, the four layer breakdown device 65 has a characteristic wherein the device breaks over and presents substantially a zero voltage drop across itself upon reaching a level of about 7.3 volts and the alternating current source 40 has in a typical installation a peak value of about 34 volts.

In this automatic changeover heat-cool solid state thermostat it can generally be stated that a sufficient bridge unbalance in one sense will actuate the cool load 44 by way of triac 91 and a sufficient degree of unbalance of the bridge 14 in the opposite sense will render triac 104 conductive to energize the heat load 43. There is a deadband between these two extremes in which neither the cooling load nor the heating load is actuated. It will also be considered that heat load 43 is an alternating current type of load that controls the heating source, that cooling load 44 is an alternating current type of load that controls the cooling source. It will also be initially assumed that at the application of power to the system no heating or cooling is being called for due to the temperature at the negative temperature coefficient thermistor 15 being at or near the setpoint.

Assume now an instantaneous period of time in the alternating current voltage waveform in which terminal 45 is just beginning to become positive with respect to terminal 47. A current will then begin to flow through conductor 51, the upper left hand diode of the fullwave bridge rectifier 52 and is applied as a rising potential at terminal 54 with respect to terminal 55. This rising potential will cause the transistor 62 to become conductive by the base drive current flowing through resistor 63 and current will be conducted from the collector to emitter of transistor 62 to provide a rising potential at the conductor 12. The current will thus begin to flow through the temperature responsive bridge 14 and the differential amplifier 22. At this time the potential at junction 64 will be rising but will be below the breakdown potential of the four layer diode 65. The differential amplifier and current comparators 22 will compare the voltage between the junctions 16 and 17 of the temperature responsive bridge to determine whether an output is necessary. In accordance with the initial premise that no output is necessary, the bridge 14 is sufficiently near balance that neither heating nor cooling outputs are required. In the amplifier and current comparator 22 this means that the current comparator transistors 27 and 31 are accepting the currents, respectively, from the current source electrodes $c_1$ of transistor means 24 and 25 and thus no currents are flowing in the diodes 36 and 36' to trigger the SCR or SCR'. Since the silicon controlled rectifiers are not triggered to conduction the triacs 91 and 104 do not conduct.

In the half cycle of applied voltage being considered, the potential appearing at junction 64 continues to rise until it reaches the breakover potential of the four layer diode 65, which then suddenly begins to conduct current with very little voltage drop across it. This in effect shorts the junction 64 to the potential at conductor 75 and the transistor 62 ceases to conduct thereby removing the potential from the conductor 12 for the remainder of the half cycle being considered. The resistor 63 has a relatively high impedance thereby limiting the current drawn by the circuit to a very low value so that the dissipation of the total circuit is maintained at a minimum when the heat load or the cool load is not being called upon to operate. This same operating function occurs on the subsequent or reverse half cycle since the fullwave bridge 52 provides again the same voltage at terminal 54 and 55 wherein a voltage rise at junction 54 is provided with respect to junction 55.

During this same half cycle a charging path for the capacitor 113 may be traced from terminal 46 through resistor 110, and diode 111 whereby capacitor 113 takes on a charge such that junction 112 is positive with respect to conductor 75. The potential charge on capacitor 113 is connected by resistor 114 to the conductor 20 and provides a voltage differential for cooling. In the discussion to follow, when the SCR fires it will be appreciated that the SCR discharges capacitor 113 through resistor 115. Also during this same half cycle a charging path for the capacitor 107 may be traced from junction 54 through resistor 61 and diode 105 whereby capacitor 107 takes on a charge such that junction 106 is positive with respect to conductor 75. The potential on capacitor 107 is connected by resistor 108 to the conductor 21 and provides a voltage differential for heating. In the discussion to follow, when the SCR' fires, it will be appreciated that the SCR' discharges capacitor 107 through resistor 109.

If it now is assumed that the considerations being sensed by the NTC resistor 15 have changed beyond the deadband so that it is desirable to energize the heat load 43 a different function will occur. As the voltage at terminal 54 begins to rise with respect to terminal 55, the transistor 62 begins to conduct as previously explained. The differential amplifier 24 and 25 is now unbalanced with the current from transistor means 25 having increased and the current from transistor means 24 having decreased. The decreasing current in electrode $24c_2$ reduces the bias current through the current comparator transistor 31 so that the magnitude of current which can flow in the collector circuit of transistor 31 is reduced at the same time that the current through electrode $25c_1$ is increasing, thus an output current flows in the diode 36' and resistor 40' to trigger the SCR'. The rising potential at conductor 12 causes a current flow through the resistors 92 and 94, diode 95 and the now conductive SCR'. The potential developed across the resistor 92 renders the transistor 97 conductive which in turn renders conductive the transistor 98. A current path may now be traced from the terminal 45 through the resistors 103 and 101, transistor 98 and diode 99 to the terminal 47. The potential appearing on junction 102 is now sufficient to trigger the triac 104 to conduction whereupon the heat load 43 is actuated as the triac shorts together terminals 45 and 47 and applies the full potential from the source 40 across the load 43. The triac 104 having fired, the potential is removed from the control circuit 50 for the remainder of the half cycle of supply voltage.

On the subsequent half cycle with a reversal of polarity of the voltage from source 40 it will be seen that the voltage applied across the triac 104 has been reversed but the control circuit 50 retains the same polarity due to the fullwave rectifier 52. Under these conditions, a call for the operation of load 43 still being present, current still flows through the transistor 97 as before but with the potentials at conductors 51 and 53 having reversed in polarity the transistor 98 acts as a steering diode allowing current flow from the collector transistor 97 through the base collector path of transistor 98 and up through resistors 101 and 103 to conductor 51 to trigger the triac 104, and energize heat load 43.

Assume now ambient conditions have changed and a period requiring cooling has been reached, the bridge 14 having become unbalanced in the opposite sense from that previously discussed. Terminal 16 is now less positive and terminal 17 and transistor means 24 is conducting more than transistor means 25. Both current source electrodes $c_1$ and $c_2$ of transistor means 24 have thus increased in conduction while the currents flowing in current source electrodes $c_1$ and $c_2$ of transistor means 25 have decreased.

When the current from electrode $24c_1$ is larger than the current comparator transistor 27 accepts an output current flows in the diode 36 and resistor 40 to trigger the SCR. A current path may now be traced from the junction 10 through resistors 70 and 72, diode 73 and the SCR, the potential appearing across resistor 70 being sufficient to bias to conduction the transistor 77 which in turn renders conductive transistor 84. A current path may now be traced from the terminal 46 to the resistors 87 and 85, the transistor 84 and diode 83 to terminal 47, the potential appearing across resistor 87 being sufficient to trigger on the triac 91 to thereby energize the cool load 44.

Restated in a general fashion, the condition responsive circuit 50 must decide whether to turn on either of the loads 43 or 44 before the voltage appearing across the four layer diode 65 reaches its breakover potential, which occurs very early in each half cycle of the applied line voltage. This permits a limitation of the current being drawn by the temperature responsive circuit and limits the internal dissipation of the devices thereby making the circuit practical as a thermostat or temperature control system.

The embodiments of the invention in which an exclusive property or right is claimed are defined as follows:

1. An improved dual output differential amplifier and current comparator circuit for selectively providing an electrical output at either of a first or a second output terminal in response to a signal comprising:

first solid state current control means having a control electrode, an input electrode and first and second current source electrodes;

second solid state current control means having a control electrode, an input electrode and first and second current source electrodes;

conductive means including impedance means connecting said input electrodes together and to a first energizing terminal;

circuit means for connecting said control electrodes to a control signal such that said first and second current control means are normally conductive;

first and second solid state current comparator means each having a plurality of terminals comprising at least a first control input terminal, a second input terminal, and a common terminal, said first comparator means second input terminal being connected to said first current control means first current source electrode, said second comparator means second input terminal being connected to said second current control means first current source electrode and, said common terminals of said first and second current comparator means being connected to a second energizing terminal;

and connection means conductively connecting said second current source electrode of said first current control means to said second comparator means first control input terminal, and said second current source electrode of said second current control means to said first comparator means first control input terminal whereby said first and second current comparator means are normally biased to conduction.

2. The invention of claim 1 in which said solid state current control means and said solid state current comparator means are transistor means.

3. The invention of claim 1 in which said first solid state current control means is a PNP transistor having two collector electrodes as the first and second current source electrodes.

4. The invention of claim 1 in which said first and second solid state current control means each is a composite transistor means including a PNP transistor driving a NPN transistor, which NPN transistor has two emitter electrodes as the first and second current source electrodes, the PNP base electrode is the control electrode and the PNP emitter electrode and the NPN collector electrode are connected together as the input electrode.

5. The invention of claim 1 having a deadband and in which said connection means further comprises deadband bias means providing a further resistive bias current path from said first energizing terminal to the first control input terminal of each of said comparator means.

6. A condition responsive control circuit adapted to selectively energize first load means or second load means as necessary from an alternating current voltage source, including:

three terminals for said control circuit adapted to be connected to said first load means, said second load means and said voltage source to operatively energize said control circuit to in turn selectively energize said load means;

dual output differential amplifier and current comparator means comprising, first and second solid state current control means each having a control electrode, an input power electrode and first and second current source electrodes, first and second solid state current comparator means each having a plurality of terminals comprising at least a first control input terminal, a second input terminal, and a common terminal, first output means connected to said first comparator means, second output means connected to said second comparator means, bias providing means for said comparator means including the second current source electrode of said first current control means directly connected to the first control input terminal of said second comparator means, and the second current source electrode of said second current control means being directly connected to the first control input terminal of said first comparator means;

circuit means connecting said three terminals to operably energize said differential amplifier and current comparator means;

condition responsive voltage divider network means connected to said first and second current control means control electrode;

first solid state switch means connected across the first and third terminals;

second solid state switch means connected across the second and third terminals;

said first and second switch means being connected to and selectively controlled by said first and second output means.

7. The invention of claim 6 in which said first and second solid state current control means are normally biased to condition and in which said first and second solid state current comparator means are normally biased to conduction.

* * * * *